(12) United States Patent
Han

(10) Patent No.: US 6,826,322 B2
(45) Date of Patent: Nov. 30, 2004

(54) ASTIGMATISM CORRECTING OPTICAL COUPLER

(75) Inventor: Xiaofeng Han, Allentown, PA (US)

(73) Assignee: Agility Communications, Inc., Goleta, CA (US)

( * ) Notice: Subject to any disclaimer, the term of this patent is extended or adjusted under 35 U.S.C. 154(b) by 136 days.

(21) Appl. No.: 09/946,827

(22) Filed: Sep. 4, 2001

(65) Prior Publication Data

US 2002/0181123 A1 Dec. 5, 2002

Related U.S. Application Data

(60) Provisional application No. 60/296,066, filed on Jun. 4, 2001.

(51) Int. Cl.[7] .................................................. G02B 6/26
(52) U.S. Cl. .................................... 385/15; 385/33
(58) Field of Search ................................ 359/652, 653, 359/654, 708; 385/15, 33, 51, 52; 372/43

(56) References Cited

U.S. PATENT DOCUMENTS 5,802,224 A * 9/1998 Okuta et al. .................. 385/51

OTHER PUBLICATIONS

Zemax, Optical Design Program, User's Guide, Version 10.0, Focus Software, Inc., Apr. 2001, 13 pp.

* cited by examiner

Primary Examiner—Hung Xuan Dang
(74) Attorney, Agent, or Firm—Gates & Cooper LLP

(57) ABSTRACT

Presented herein is an astigmatism correcting coupler. The couplet comprises a collimating lens, a focusing lens, and a power adjusting lens element. The power adjusting lens element may be positioned intermediate the collimating lens and focusing lens, or positioned after the focusing lens element.

27 Claims, 2 Drawing Sheets

ASTIGMATISM CORRECTING OPTICAL COUPLER

This application claims the benefit of Provisional Application No. 60/293,066, filed Jun. 4, 2001.

BACKGROUND OF THE INVENTION

The present invention relates generally to optical components. More particularly, the present invention relates to the coupling of light transmitted between two or more optical components. Most particularly, the present invention relates to the conditioning of an output lightwave from an edge-emitting diode laser to provide for improved coupling efficiencies between the laser and optical fiber.

DESCRIPTION OF THE RELATED ART

Generally, light output from lasers, and most specifically from edge-emitting diode lasers, has different divergence angles in the lateral (x-z) and the transverse (y-z) planes. As such, the output wave-front has a non-spherical cross-sectional configuration, as is shown in FIG. 1. This is most commonly referred to as astigmatism.

Astigmatism of an output beam results in lower coupling efficiencies into a fiber or other components resulting in a related loss of optical power where any such coupling takes place. As such, what is needed in the art is an astigmatism correcting coupler for coupling a lightwave into optical fiber or some other passive or active component.

SUMMARY OF THE INVENTION

To address the deficiencies set out hereinabove, and in accordance with the present invention, an astigmatism correcting coupler (alternatively referred to as a "coupler") shall be disclosed including a preferred embodiment.

DETAILED DESCRIPTION

Figure 1:
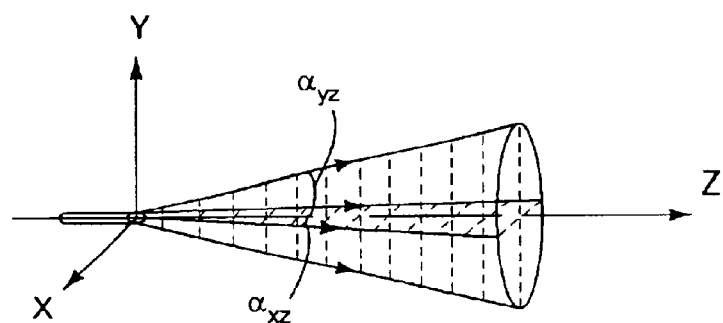
FIG. 1 illustrates the divergence angles of astigmatic laser diode output in the y-z plane, or the transverse plane, versus the x-z plane or the lateral plane.
Figure 2A:
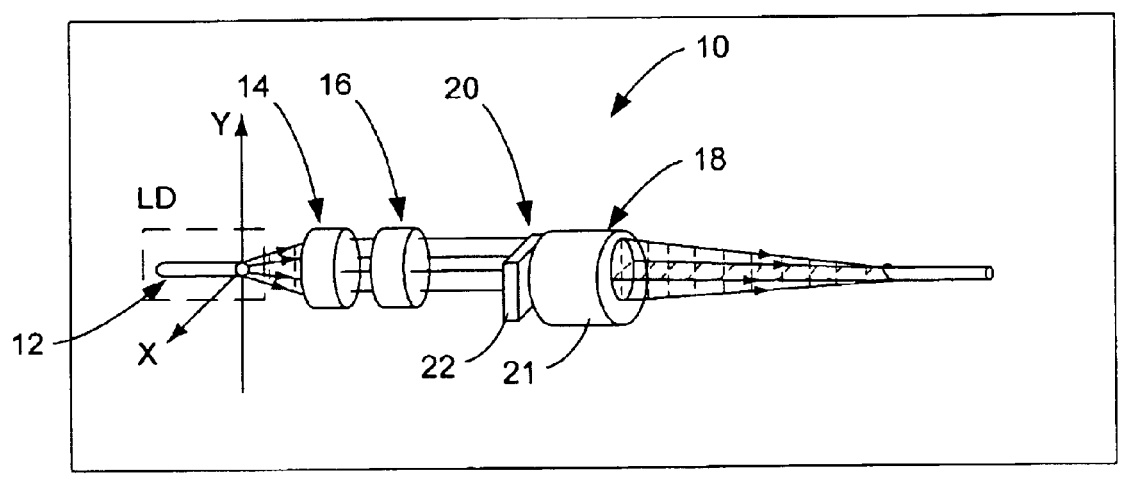
FIGS. 2A an 2B illustrate an astigmatism correction optical coupler in accordance with the present invention.
Figure 2B:
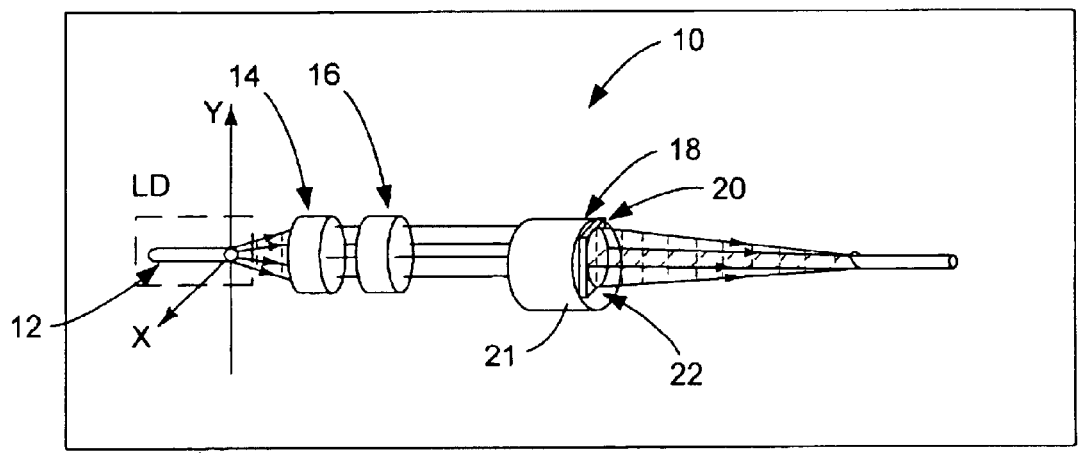

As depicted in FIGS. 2A and 2B an astigmatism correcting coupler 10 of the present invention is generally intended to function with a laser diode 12 ("LD"). A LB may be generally housed in what shall be referred to herein as a tunable laser assembly ("TLA"). The diode is housed within and is a subcomponent of the UA. Additionally, the TLA houses a controller, which comprises hardware and firmware loaded thereupon. The TLA also comprises connectors extending between the controller and the LDM providing for electrical communication therebetween.

The TLA also includes output optics. These optics are generally included to collimate the output beam of the laser diode, reduce reflection back into the laser diode and collect light beam into fiber.

It is difficult to couple most of the optical power of a lightwave into single mode optical fiber. As such, and in accordance with the present invention, and as shown in FIGS. 2A and 2B, an anti-astigmatism coupler comprises a collimating lens 14. The collimating lens may be an aspherical or spherical micro-lens, a GRIN lens, or some other lens that is known to collimate a beam of coherent light.

The coupler 10 additionally comprises an optical isolator 16. The isolator 16 substantially eliminates reflections back towards the laser diode. The optical isolator 16 is preferably positioned in between the collimating and a focal, or focusing lens 18 to block any light that may be reflected back towards the laser diode. Isolators are well known in the art and as such shall not be discussed in further detail hereinbelow.

The focusing lens 18 may be a GRIN lens, which is well known in the art. Alternatively, the focusing lens 18 may be a spherical or aspherical micro lens, or some other lens for focusing a substantially coherent beam of light.

A power adjusting lens element 20 is preferably positioned intermediate the collimating lens 14 and the focusing lens 18. However, the focusing power adjusting lens element 20, may also be positioned before or after the focal lens. The focusing power adjusting lens element 20 essentially adds focal power to the output lightwave on the transverse optical path or plane, and may also decrease optical power on the lateral optical path or plane. The adjustment of the optical power decreases or eliminates any astigmatism.

The power adjusting lens element 20 may comprise a cylindrical lens 22 which is added in the collimated beam path, as shown as in FIGS. 2A and 2B. The focal power of the cylindrical lens 22 can be designed as:

$$1/Bf_{yz} - 1/Bf_{xz}$$

where Bf equals the back focal length that is the length from the last surface of the cylindrical lens 22 to the focal point in the respective plane.

Figure 3:
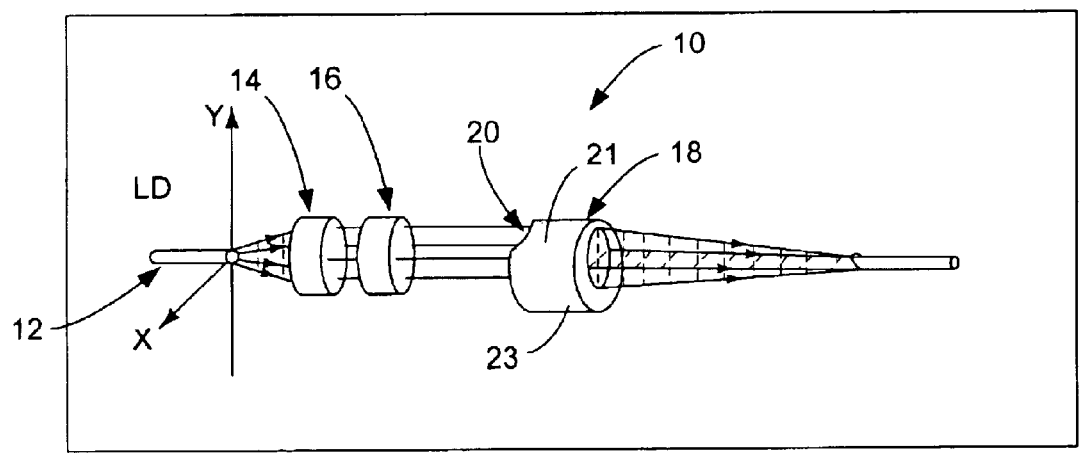
FIG. 3 illustrates an astigmatism correcting optical coupler in accordance with the present invention.

The power adjusting lens element 20 may alternatively be formed from a surface of the focusing lens 18, as shown in FIG. 3. For example, if the focusing lens 18 is a GRIN lens 21, the GRINS lens 21 may be cylindrically polished with different focal powers in the lateral and transverse planes, as shown in FIG. 3. This Plano-cylindrical polished GRIN lens 23 then corrects for astigmatic effects by adjusting the power on the transverse and lateral planes. If a certain focal power is added on transverse or decreased on lateral in optical path, the astigmatism can be decreased or destroyed.

Figure 4:
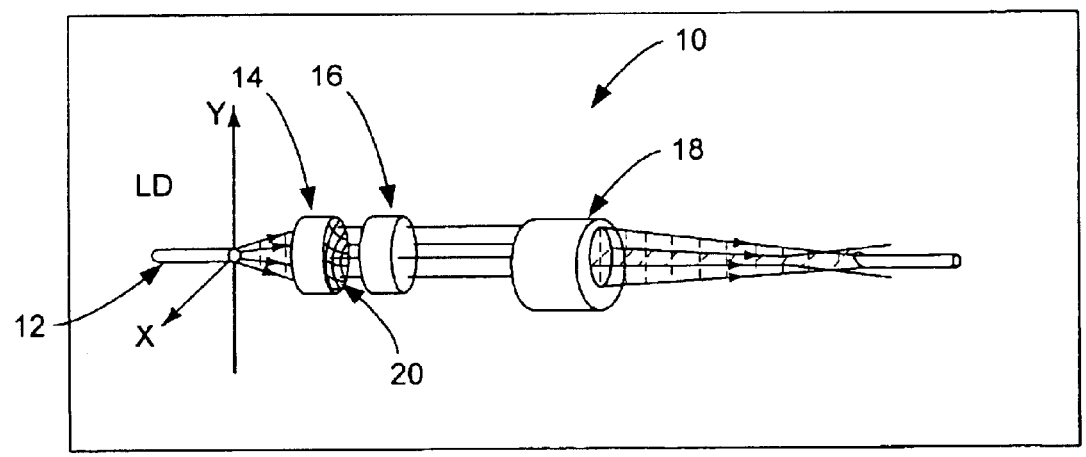
FIG. 4 illustrates an astigmatism correcting optical coupler in accordance with the present invention.

The power adjusting lens element 20 may alternatively comprise an aspherical lens having one or more toric surfaces to make the lens have different focal power in lateral and transverse planes. This is shown in FIG. 4. Conventionally the surface of an even aspherical lens is expressed by the equation:

$$z = \frac{cr^2}{1 + \sqrt{1 - (1+k)c^2 r^2}} + \sum_{i=1} \alpha_i r^{2i} \qquad (1)$$

where $r + \sqrt{x^2 + y^2}$ is the radial coordinate, c is the curvature of the surface, k is the conic constant and the $\alpha$ terms are aspheric coefficients. The surface is a rotational symmetry along the optical axis Z. The focal power is same in lateral and transverse planes. We can modify Eq. (1) to a toric surface with non-rotational symmetry, $$z = \frac{c_1 x^2 + c_2 y^2}{1 + \sqrt{1 - (1+k_1)c_1^2 x^2 - (1+k_2)c_2^2 y^2}} + \sum_{i=1} (\alpha_i x^{2i} + \beta_i y^{2i}) \qquad (2)$$

As such, there are more parameters added. We may choose different parameters to make a toric even aspherical lens to correct astigmatism. And thus, the power adjusting lens element 20 may be formed on the collimating lens 14 and serve as a portion thereof.

*Equation (1) is referred on the manual of ZEMAX, Optical Design Program.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An astigmatism correcting coupler comprising:
   a collimating lens;
   a focusing lens; and
   a power adjusting lens element positioned intermediate the collimating lens and the focusing lens.
2. The astigmatism correcting coupler of claim 1 further comprising an optical isolator.
3. The astigmatism correcting couplet of claim 2 wherein said optical isolator is positioned intermediate the collimating lens and the focusing lens.
4. The astigmatism correcting coupler of claim 1 wherein said focusing lens is a GRIN lens.
5. The astigmatism correcting coupler of claim 4 wherein said power adjusting lens is formed from a surface of the GRIN lens.
6. The astigmatism correcting coupler of claim 1 wherein said focusing lens is a spherical lens.
7. The astigmatism correcting coupler of claim 6 wherein said power adjusting lens is formed from a surface of the spherical lens.
8. The astigmatism correcting coupler of claim 1 wherein said focusing lens is an aspherical lens.
9. The astigmatism correcting coupler of claim 8 wherein said power adjusting lens is formed from a surface of the aspherical lens.
10. An astigmatism correcting coupler comprising:
    a collimating lens;
    a focusing lens; and
    a power adjusting lens element positioned after the focusing lens.
11. The astigmatism correcting couplet of claim 10 further comprising an optical isolator.
12. The astigmatism correcting couplet of claim 11 wherein said optical isolator is positioned intermediate the collimating lens and the focusing lens.
13. The astigmatism correcting couplet of claim 10 wherein said focusing lens is a GRIN lens.
14. The astigmatism correcting coupler of claim 13 wherein said power adjusting lens is formed from a surface of the GRIN lens.
15. The astigmatism correcting couplet of claim 10 wherein said focusing lens is a spherical lens.
16. The astigmatism correcting couplet of claim 15 wherein said power adjusting lens is formed from a surface of the spherical lens.
17. The astigmatism correcting couplet of claim 10 wherein said focusing lens is an aspherical lens.
18. The astigmatism correcting couplet of claim 15 wherein said power adjusting lens is formed from a surface of the aspherical lens.
19. A diode laser in combination with an astigmatism correcting couplet comprising:
    a diode laser;
    a collimating lens;
    a focusing lens; and
    a power adjusting lens element positioned after the focusing lens.
20. The astigmatism correcting couplet of claim 19 further comprising an optical isolator.
21. The astigmatism correcting couplet of claim 20 wherein said optical isolator is positioned intermediate the collimating lens and the focusing lens.
22. The astigmatism collecting couplet of claim 19 wherein said focusing lens is a GRIN lens.
23. The astigmatism correcting couplet of claim 22 wherein said power adjusting lens is formed from a surface of the GRIN lens.
24. The astigmatism correcting coupler of claim 19 wherein said focusing lens is a spherical lens.
25. The astigmatism correcting coupler of claim 24 wherein said power adjusting lens is formed from a surface of the spherical lens.
26. The astigmatism correcting couplet of claim 19 wherein said focusing lens is an aspherical lens.
27. The astigmatism correcting coupler of claim 26 wherein said power adjusting lens is formed from a surface of the aspherical lens.

* * * * *

UNITED STATES PATENT AND TRADEMARK OFFICE
CERTIFICATE OF CORRECTION

PATENT NO. : 6,826,322 B2
DATED : November 30, 2004
INVENTOR(S) : Xiaofeng Han

It is certified that error appears in the above-identified patent and that said Letters Patent is hereby corrected as shown below:

Title page,
Item [57], ABSTRACT,
Line 20, "couplet" should read -- coupler --.

Column 4,
Lines 4, 11, 14, 16, 28, 31, 33 and 41, "couplet" should read -- coupler --.
Line 31, "collecting" should read -- correcting --.

Signed and Sealed this

Twelfth Day of April, 2005

JON W. DUDAS
*Director of the United States Patent and Trademark Office*